US012198758B2

(12) United States Patent
Aoki

(10) Patent No.: US 12,198,758 B2
(45) Date of Patent: Jan. 14, 2025

(54) SEMICONDUCTOR MEMORY DEVICE AND WRITE METHOD THEREOF

(71) Applicant: Winbond Electronics Corp., Taichung (TW)

(72) Inventor: Hajime Aoki, Yokohama (JP)

(73) Assignee: WINBOND ELECTRONICS CORP., Taichung (TW)

( * ) Notice: Subject to any disclaimer, the term of this patent is extended or adjusted under 35 U.S.C. 154(b) by 168 days.

(21) Appl. No.: 18/076,991

(22) Filed: Dec. 7, 2022

(65) Prior Publication Data

US 2023/0176750 A1 Jun. 8, 2023

(30) Foreign Application Priority Data

Dec. 7, 2021 (JP) ................................. 2021-198647

(51) Int. Cl.
*G11C 7/06* (2006.01)
*G11C 13/00* (2006.01)

(52) U.S. Cl.
CPC ........ *G11C 13/004* (2013.01); *G11C 13/0064* (2013.01); *G11C 13/0069* (2013.01); *G11C 2213/79* (2013.01)

(58) Field of Classification Search
CPC .............. G11C 13/004; G11C 13/0064; G11C 13/0069; G11C 2213/79
USPC ..................................................... 365/189.07
See application file for complete search history.

(56) References Cited

U.S. PATENT DOCUMENTS

| 7,525,858 | B2* | 4/2009 | Lee | G11C 11/4091 365/205 |
| 7,529,130 | B2* | 5/2009 | Toda | G11C 16/0483 365/185.12 |
| 8,009,488 | B2* | 8/2011 | Park | G11C 11/4076 365/207 |
| 8,031,511 | B2* | 10/2011 | Osada | G11C 13/0004 365/163 |
| 8,077,501 | B2* | 12/2011 | Ong | G11C 11/1673 365/158 |
| 9,548,097 | B2* | 1/2017 | Noguchi | G11C 11/1673 |

(Continued)

FOREIGN PATENT DOCUMENTS

| CN | 101872647 B | 1/2014 |
| JP | 5748877 B1 | 7/2015 |
| TW | 201742073 A | 12/2017 |

*Primary Examiner* — Viet Q Nguyen
(74) *Attorney, Agent, or Firm* — Birch, Stewart, Kolasch & Birch, LLP

(57) ABSTRACT

A semiconductor memory device according to the present invention has a memory cell array, a write-driving/bias-reading circuit, a control circuit and a sense amplifier. The control circuit outputs a VSLC (Verify Sense Load Control) signal generated according to writing data. After the write-driving/bias-reading circuit applied the writing pulse and the complementary writing pulse, the sense amplifier receives the VSLC signal and detects the current difference between two currents respectively flowing through a first data line and a second data line; the first data line and the second data line respectively connecting a true memory cell and a complementary memory cell of the selected pair of memory cell. The control circuit controls to provide the additional current to at least one of the first data line and the second data line so as to make the detected current difference meet the required margin.

19 Claims, 11 Drawing Sheets

(56) References Cited

U.S. PATENT DOCUMENTS

| | | | |
|---|---|---|---|
| 9,711,221 B1 | 7/2017 | Li | |
| 9,754,664 B2 * | 9/2017 | Noguchi | G11C 7/18 |
| 9,991,000 B2 * | 6/2018 | Calvetti | G11C 13/004 |
| 10,510,411 B2 | 12/2019 | Lee et al. | |
| 10,777,272 B2 * | 9/2020 | Aoki | G11C 11/1673 |
| 11,574,678 B2 * | 2/2023 | Tamura | G11C 13/004 |
| 2011/0242885 A1 * | 10/2011 | Kim | G11C 13/0023 |
| | | | 365/163 |
| 2013/0033929 A1 * | 2/2013 | Kim | G11C 13/0028 |
| | | | 365/163 |
| 2017/0069380 A1 * | 3/2017 | Takahashi | G11C 11/1675 |
| 2020/0243126 A1 | 7/2020 | Jacob et al. | |
| 2021/0005243 A1 | 1/2021 | Bae | |

* cited by examiner

|  | State | $\overline{VSLC\_T}$ | $\overline{VSLC\_C}$ | $\overline{EN}$ |
|---|---|---|---|---|
| Writing data is "1" True memory cell: SET (LRS) Complement memory cell: RESET (HRS) | Verifying | L | H | L |
|  | Reading | H | H | L |
|  | The others | H | H | H |

FIG. 11A

|  | State | $\overline{VSLC\_T}$ | $\overline{VSLC\_C}$ | $\overline{EN}$ |
|---|---|---|---|---|
| Writing data is "0" True memory cell: RESET (HRS) Complement memory cell: SET (LRS) | Verifying | H | L | L |
|  | Reading | H | H | L |
|  | The others | H | H | H |

FIG. 11B

SEMICONDUCTOR MEMORY DEVICE AND WRITE METHOD THEREOF

CROSS REFERENCE TO RELATED APPLICATIONS

This application claims priority of Japanese Patent Application No. 2021-198647, filed on Dec. 7, 2021, the entirety of which is incorporated by reference herein.

BACKGROUND OF THE INVENTION

Field of the Invention

The present disclosure relates to semiconductor memory devices, and, in particular, it relates to a semiconductor device having a true memory cell and a complementary memory cell and a method for write-in verification thereof.

Description of the Related Art

Variable-resistance memory can store data in a reversible and non-volatile way by applying pulse voltage to the variable-resistance element. The variable-resistance element, for example, is a thin film made of metal oxide such as hafnium oxide (HfOx), and becomes a high-resistance state or a low-resistance state depending on the magnitude and polarity of the applied pulse voltage. For example, to write the variable resistance element to the low-resistance state is referred to as "setting", and to write the variable resistance element to the high-resistance state is referred to as "resetting". The variable-resistance memory includes monopole type and dipole type. For monopole type, writing voltages for setting and resetting applied to the variable-resistance element have the same polarity. For dipole type, the polarities of writing voltages for setting and resetting applied to the variable-resistance element are opposite.

FIG. 1 schematically shows a 1T1R memory cell array of a conventional variable-resistance memory. The memory cell MC comprises a variable-resistance element connected between the source line and the bit line, and an access transistor, which can be selected bit by bit. For example, when writing the memory cell, the access transistor in the row direction is selected via the word line WL1, and the writing pulse is applied between the bit line BL1 and the source line SL1 to set or reset the selected variable-resistance element. When reading the memory cell, the access transistor in the row direction is selected via the word line WL1, and the reading pulse is applied between the bit line BL1 and the source line SL1 to sense the current or voltage flowing into the selected variable-resistance element.

FIG. 2 schematically shows a 2T2R memory cell array of a conventional variable-resistance memory. The 2T2R memory cell uses a pair of variable-resistance elements and a pair of access transistors to store data and complementary data. For example, the true memory cell MC11 includes a variable-resistance element connected between the source line SL1 and the bit line BL1, and an access transistor. The complementary memory cell $\overline{MC11}$ includes a variable-resistance element connected between the source line $\overline{SL1}$ and the bit line $\overline{BL1}$, and an access transistor. The true memory cell MC11 stores true data, while the complementary memory cell $\overline{MC11}$ stores complementary data, which is complementary respect to the true data. For example, when the true memory cell MC11 is written in the low-resistance state, the complementary memory cell $\overline{MC11}$ is written in the high-resistance state.

In the conventional variable-resistance memory, for example disclosed in Japan patent document: JP 5748877, reading the 2T2R memory cell is achieved by detecting the current difference between the current flowing through the true memory cell and the current flowing through the complementary memory cell. FIG. 3 shows an example of reading a pair of memory cells MC11 and $\overline{MC11}$. Provided that the variable-resistance element of the true memory cell MC11 is in the low-resistance state (LRS), and the variable-resistance element of the complementary memory cell $\overline{MC11}$ is in the high-resistance state (HRS).

In detail, applying the reading voltage Vw1 to the selection word line WL1 makes the access transistors of the memory cells MC11 and MC11 turn on, and applying the voltage of 0V to the non-selection word line WL2 makes the access transistors of the memory cells MC21 and $\overline{MC21}$ turn off. Besides, it makes the memory cell MC11 coupled with one input of the sense amplifier 10 via the transistors Q1 and Q2, and makes the bit line BL1 be connected to the ground potential GND via the transistor Q4. Likewise, it makes the source line $\overline{SL1}$ of the memory cell $\overline{MC11}$ be coupled with the other input of the sense amplifier 10 via the transistors Q6 and Q7, and make the bit line $\overline{BL1}$ be connected to the ground potential GND via the transistor Q9. Further, it makes the transistor Q5 be connected between the source line SL1 and the source line $\overline{SL1}$ turn off, and makes the transistor Q10 connected between the source $\overline{SL1}$ and the reference-current generation unit 30 turn off.

To activate the sense amplifier 10, the signal VSAREF is used to turn on the transistors such that the source line SL1 and the source line $\overline{SL1}$ connect to the sense amplifier 10. The sense amplifier 10 detects the current difference $\Delta I$ ($=|I_T-I_C|$) between the reading current $I_T$ flowing from the source line SL1 via the memory cell MC11 into the bit line BL1, and the current $I_C$ flowing from the source line $\overline{SL1}$ via the memory cell $\overline{MC11}$ into the bit line $\overline{BL1}$, and outputs data Dout of "1" or "0" according to the detected result.

FIG. 4 is an example showing the distributions of currents following into the variable-resistance element when setting/resetting the variable-resistance element. In initial stage, a greater margin exists between the initial HRS current distribution HRS_initial and the initial LRS current distribution LRS_initial. However, the filamentous current path in the variable-resistance element is aged as the number of writing the variable-resistance element increases such that the retention and endurance characteristics of the variable-resistance element deteriorate. As shown in FIG. 4, as the variable-resistance element is aged, the drift HRS current distribution HRS_drift and the drift LRS current distribution LRS_drift become broader and the so-called tail bit shift occurs, thereby narrowing the margin between the drift HRS current distribution HRS_drift and the drift LRS current distribution LRS_drift. Therefore, the sense amplifier 10 may fail to detect the current difference $\Delta I$ correctly and may output incorrect data.

For example, provided that the upper limit of the current distribution HRS_initial is 3 μA and the lower limit of the current distribution LRS_initial is 16 μA. When data "0" is stored (HRS), the reading current flowing into the true memory cell MC11 is 3 μA and the reading current flowing into the complementary memory cell $\overline{MC11}$ is 16 μA. The current difference $\Delta I$ is 13 μA with sufficient margin, and thus the sense amplifier 10 can detect the current difference correctly and output the data "0". In addition, when data "1" is stored (LRS), the reading current flowing into the true memory cell MC11 is 16 μA and the reading current flowing into the complementary memory cell $\overline{MC11}$ is 3 μA. The current difference ΔI is 13 µA with sufficient margin, and thus the sense amplifier 10 can detect the current difference correctly and output the data "1".

Here, provided that the tail bit shift occurs, the upper limit of the current distribution HRS_initial becomes 6 µA (shift addition 3 µA) and the lower limit of the current distribution LRS_initial becomes 10 µA (shift reduction 6 µA). When data "0" is stored, the reading current flowing into the true memory cell MC11 is 6 µA and the reading current flowing into the complementary memory cell $\overline{MC11}$ is 10 µA. The current difference ΔI is 4 µA without sufficient margin, and thus the sense amplifier 10 may fail to detect the current difference correctly and may output the data not "0". In addition, when data "1" is stored, the reading current flowing into the true memory cell MC11 is 10 µA and the reading current flowing into the complementary memory cell $\overline{MC11}$ is 6 µA. The current difference ΔI is 4 µA without sufficient margin, and thus the sense amplifier 10 may fail to detect the current difference correctly and may output the data not "1".

To correctly detect the current difference ΔI, the required margin setting is performed in the verification during set/reset writing. FIG. 5 is a flow chart showing the verification during the conventional reset writing. Once the control circuit, not depicted, received the writing data "0" (S10), it applies a reset pulse to the true memory cell (S20). For example, when reset writing to the true memory cell MC11 is performed, the writing pulse is applied to the source line SL1 via the transistor Q3.

Next, the reset verification for the true memory cell is performed (S30). If the verification is fail, the reset writing pulse is applied again and the verification is repeated, until pass the eventual reset verification, and then a set pulse is applied to the complementary memory cell (S40). For example, if the set writing is performed to the complementary memory cell $\overline{MC11}$, the set writing pulse is applied to the bit line $\overline{BL1}$ via the transistor Q9. Next, the set verification for the complementary memory cell (S50) is perfomed. If the verification is fail, the set writing pulse is applied again and the verification is repeated, until pass the eventual set verification, and then the reset writing is finished. In addition, during the set writing, the set pulse is applied to the true memory cell and then the set verification is performed. If the set verification is pass, the reset writing pulse is applied to the complementary memory cell and then the reset verification is performed. For example, if the set writing to the true memory cell MC11 is desired, the set writing pulse is applied to the bit line BL1 via the transistor Q4.

FIG. 6 shows the operation of the set verification for the true memory cell MC11. FIG. 7 shows the operation of the reset verification for the true memory cell MC11. In the set verification, the sense amplifier 10 detects the current difference between the current $I_{SET}$ flowing through the true memory cell MC11 and the reference current $I_{REF}$ for set verification generated by the reference current generation unit 30, and the decision circuit 20 determines whether the set verification is qualified according to the detected current difference. During the set verification, the transistor Q6 turns off and thus the sense amplifier 10 is disconnected with the source line, and the transistor Q10 turns on and thus the sense amplifier 10 is connected to the reference current generation unit 30.

During the reset verification, as shown in FIG. 7, the sense amplifier 10 detects the current difference between the current $I_{RESET}$ flowing through the complementary memory cell $\overline{MC11}$ and the reference current $I_{REF}$ for reset verification generated by the reference current generation unit 30, and the decision circuit 20 determines whether the reset verification is qualified according to the detected current difference. During the reset verification, the transistor Q2 turns off and the transistor Q5 turns on, and the source line $\overline{SL1}$ instead of the source line SL1 is coupled to the sense amplifier 10.

The conventional verification for the variable-resistance memory may involve the following problems. As shown in FIG. 5, if the reset writing is performed, the reset verification for the true memory cell and the set verification for the complementary memory cell are required respectively; and if the set writing is performed, the set verification for the true memory cell and the reset verification for the complementary memory cell are required respectively. In other words, at least two verifications are required when one set or reset writing is performed, resulting in longer time for the writing.

In addition, because the wiring resistance and load capacitance of the source line change depending on the position of the selected memory cell, and therefore the read current $I_{SET}$ and the read current $I_{RESET}$ may change depending on the position of the selected memory cell. For example, when the read current of the furthest memory cell away from the sense amplifier 10 becomes too small, the current difference from the reference current $I_{REF}$ is difficult to detect, resulting in an error in the verification judgment. Therefore, it is necessary to adjust the read bias conditions (levels of WL/SL/BL) or the reference current according to the position of the selected memory cell, and such adjustment causes the problem of complicating the circuit and increasing the area.

BRIEF SUMMARY OF THE INVENTION

In order to solve the problem of the conventional art described above, the present invention provides a semiconductor memory device which can avoid complicating circuit complexity or increasing area, and ensure verifying accuracy and reduce writing time.

According to the present invention, the semiconductor memory device includes a memory cell array, a write-driving/bias reading circuit, a control circuit, and a sense amplifier. The memory cell array has a plurality of memory cells. The write-driving/bias-reading circuit is configured to apply a writing pulse and a complementary writing pulse to a pair of memory cells selected from the memory cell array, the writing pulse and the complementary writing pulse corresponding to writing data and complementary data of the writing, respectively. The control circuit is configured to output a VSLC (Verify Sense Load Control) signal generated according to the writing data. The sense amplifier is configured to receive the VSLC signal after the writing pulse and the complementary writing pulse are applied, and to detect a current difference between a first current flowing through a first data line connected to a true memory cell of the pair of memory cells and a second current flowing through a second data line connected to a complementary memory cell of the pair of memory cells. Wherein, the control circuit controls, via the VSLC signal, for providing an additional current to at least one of the first data line and the second data line so as to make the current difference at least meet a required margin.

According to the present invention, a method of writing a semiconductor memory device, for writing a pair of memory cells selected from a memory cell array of the semiconductor memory device, comprises the steps of: receiving writing data; applying a writing pulse to a true memory cell of the selected pair of memory cells; applying a complementary writing pulse which are complementary with respect to the writing pulse, to a complementary memory cell of the selected pair of memory cells; generating a VSLC (Verify Sense Load Control) signal according to the writing data; after the writing pulse and the complement writing pulse being applied, receiving the VCLC signal by a sense amplifier of the semiconductor memory device, and detecting a current difference between a first current flowing through a first data line connected to the true memory cell and a second current flowing through a second data line connected to the complementary memory cell. Wherein, before the current difference is determined, provide an additional current to at least one of the first data line and the second data line according to the VSLC signal, to make the current difference at least meet a required margin.

According to the present invention, during the verification for the writing, the current difference between the current flowing through the first data line connected to one of the memory cell and the current flowing the second data line connected to the other one of the memory cell is detected, and therefore even though the wiring resistance and the load capacitance of the data lines change depending on different position of the selected memory cell, the wiring resistance and the load capacitance of both the data lines can be offset. In addition, the verification accuracy can be ensured, by the additional current $I_{ADD}$ applied to the first or second data line for increasing the current difference based on the writing data. Even though the current distributions of the high-resistance state and low-resistance state have shifts, the set/reset writing can be performed until a current difference is ensured for correct reading. In addition, because no need to adjust the read bias conditions (levels of WL/SL/BL) or the reference current according the position of the selected memory cell, the circuit complexity or circuit area of the present invention can be reduced.

BRIEF DESCRIPTION OF THE DRAWINGS

The present invention can be more fully understood by reading the subsequent detailed description and examples with references made to the accompanying drawings, wherein:

FIG. 11A and FIG. 11B are true tables of transistor for VSLC of the sense amplifier of the present embodiment.

DETAILED DESCRIPTION OF THE INVENTION

The semiconductor memory device can be implemented by a variable-resistance random access memory, or any semiconductor memory having a true memory cell and a complementary memory cell. The variable resistor element of the variable-resistance random access memory can be made of transition metal oxide such as oxidation hafnium (HfOx), having reversible and non-volatile characteristics, but it is not limited thereto.

Figure 8:
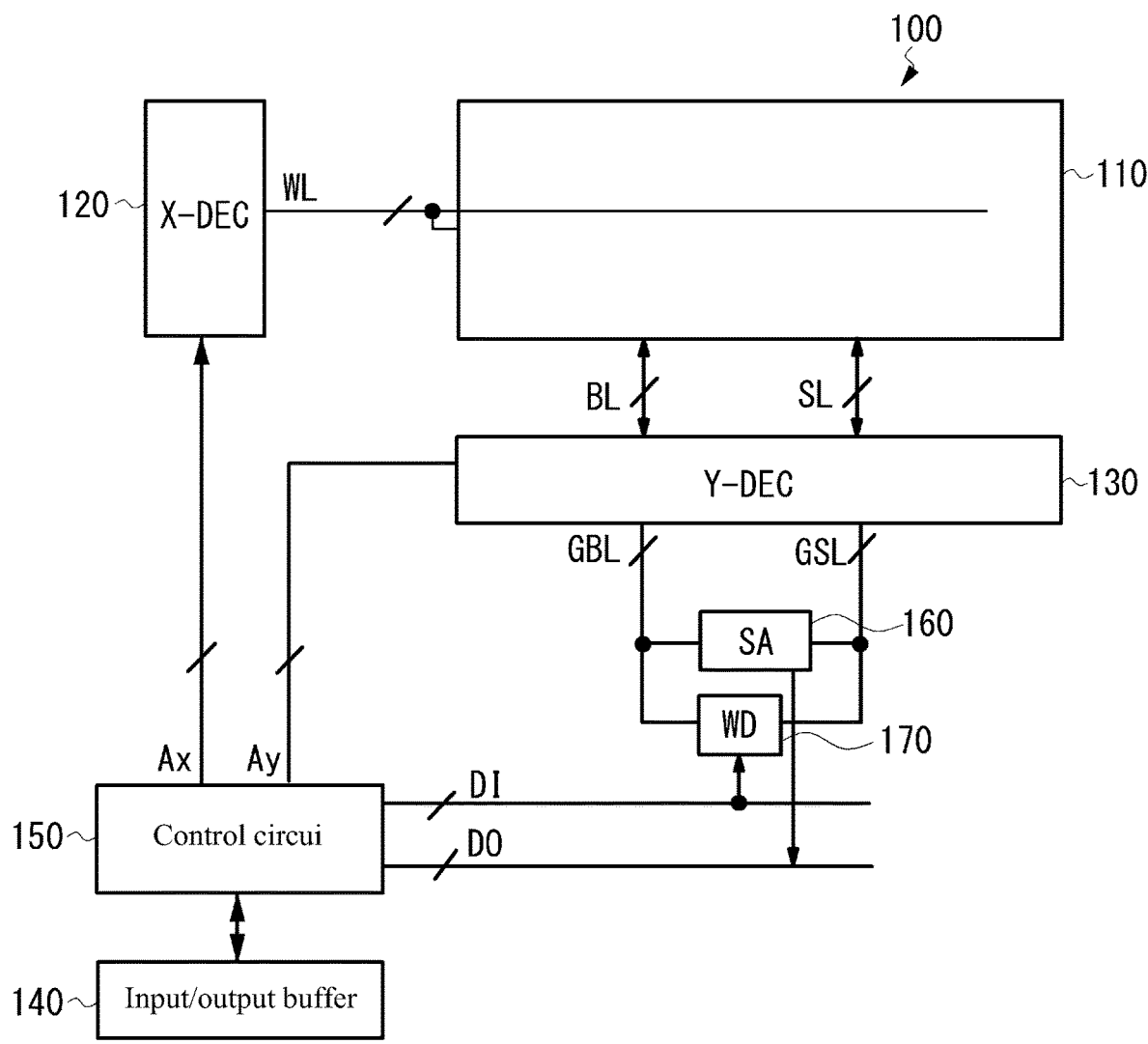
FIG. 8 is a block diagram schematically showing the structure of a variable-resistance random access memory according to one embodiment of the present invention.
Figure 9:
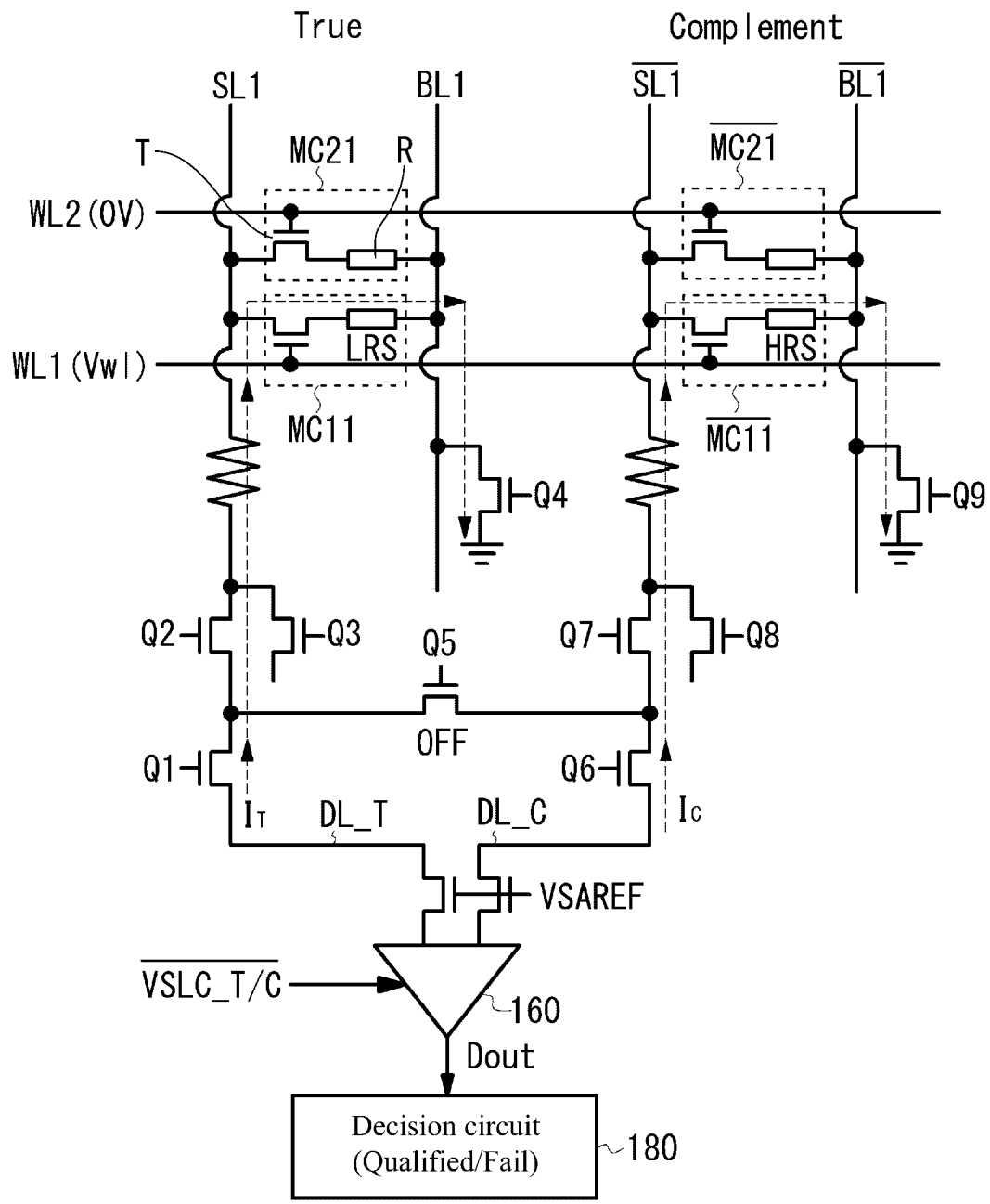
FIG. 9 is diagram for explaining the reading operation of a variable-resistance memory according to one embodiment of the present invention.

FIG. 8 is a block diagram schematically showing the structure of a variable-resistance random access memory according to one embodiment of the present invention. The variable-resistance memory 100 comprises a memory cell array 110, a row-decoder/driving-circuit (X-DEC) 120, a column decode (Y-DEC) 130, a control circuit 150, a sense amplifier 160, and a write-driving/bias-reading circuit 170. The memory cell array 110 has a plurality of memory cells (not shown in FIG. 8) arranged in a matrix, and each memory cell, as shown in FIG. 9, has a variable resistor element R and an access transistor T. The row-decoder/driving-circuit (X-DEC) 120 is configured to select and drive word lines according to the row address Ax. The column decode (Y-DEC) 130 is configured to select bit lines BL and source SL according to the column address Ay. The control circuit 150 is configured to control each portion of the variable-resistance memory 100 according to instructions, addresses, data etc. received from outside via the input/output buffer 140. The sense amplifier 160 is configured to read the data from the memory cells via the bit line BL and source line SL. The write-driving/bias-reading circuit 170 is configured to apply the voltage for reading operation to the bit line BL or the source line SL during the reading operation, and to apply a set pulse or a reset pulse corresponding to the write data during the writing operation, to the bit line BL or the source line SL.

Figure 1:
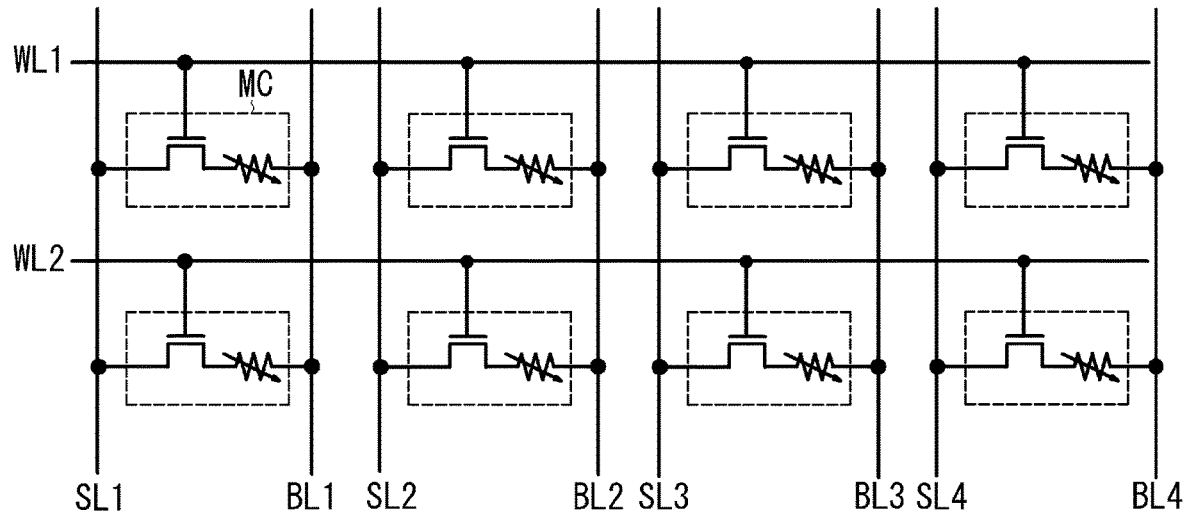
FIG. 1 schematically shows a 1T1R memory cell array of a conventional variable-resistance memory.
Figure 2:
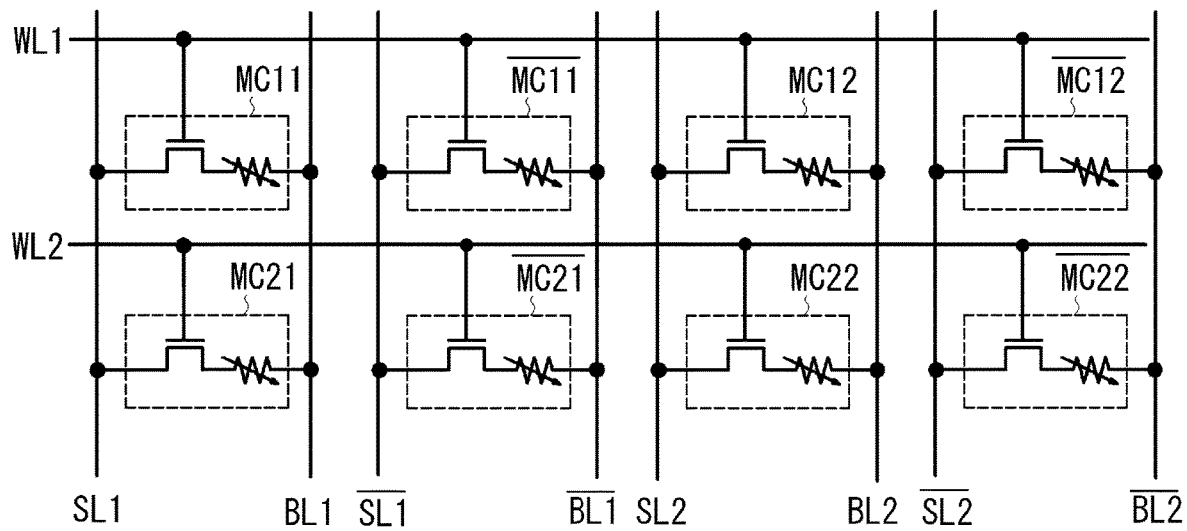
FIG. 2 schematically shows a 2T2R memory cell array of a conventional variable-resistance memory.
Figure 3:
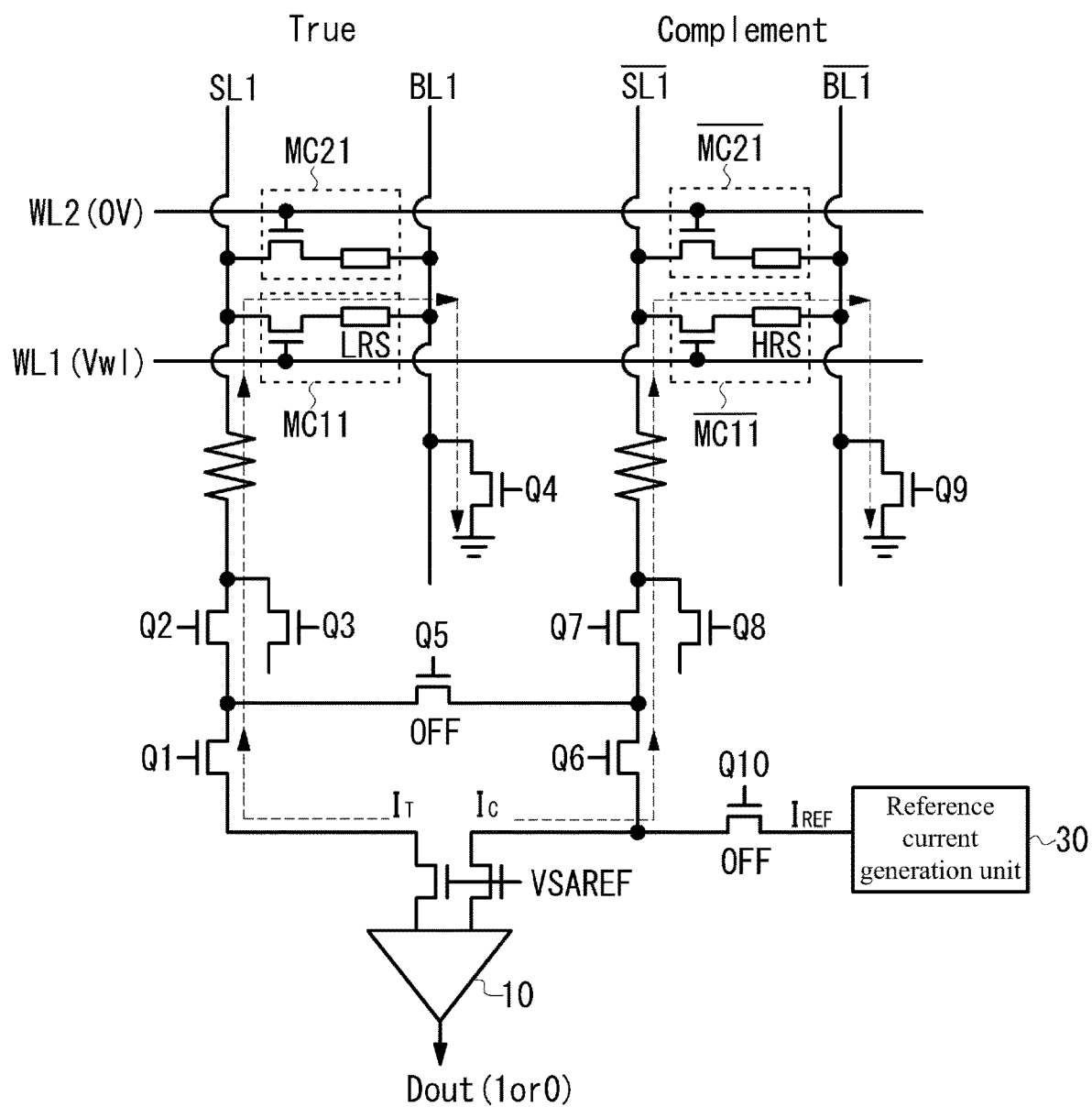
FIG. 3 schematically shows the reading operation for a conventional 2T2R memory cells.

The memory cell array 110 according to one embodiment of the present invention, as shown in FIG. 2, may be a 2T2R memory cell array for storing a pair of complementary data. In other words, one embodiment of the present invention discloses reading or writing data through a pair of true memory and a complementary memory cell.

The row decoder 120 selects the word line WL according to the input row address Ax, and the column decoder 130 selects the bit line BL and the source line SL according to the column address Ay through the global bit line GBL and global source line GSL. For example, when a pair of memory cells MC11 and $\overline{MC11}$, as shown in FIG. 9, are selected, the row decoder 120 selects the word line WL1 based on the row address Ax, and the column decoder 130 selects the pair of bit lines BL1 and $\overline{BL1}$, and the pair of source lines SL1 and $\overline{SL1}$ based on the column address Ay.

The control circuit 150 controls reading operation (readout) or writing operation (write-in) based on the instructions input through the input/output buffer 140. During the reading operation, the control circuit 150 applies the source line and the bit line of the selected memory cell with a bias voltage for reading via the write-driving/bias-reading circuit 170. The sense amplifier 160 detects the current difference ΔI between the current $I_T$ flowing through the true memory cell and the current $I_C$ flowing through the complementary memory cell, and outputs the data "0" or "1" corresponding to the detection result to the control circuit 150 via the internal data bus DO.

During the writing operation, the write-driving/bias-reading circuit 170, via the internal data bus DI, receives writing data from the control circuit 150, applies a writing pulse corresponding to the writing data to the source line and bit line of the selected memory cell, and writes the complementary data of "0" and "1" to the selected memory cell. For example, as shown in FIG. 9, when the data "1" is written to the memory cell MC11, the set writing pulse is applied to the source line SL1 via the transistor Q3, the bit line BL1 is connected to the ground potential GND via the transistor Q4, such that the variable resistor element becomes to be the low-resistance state (LRS). When the data "0" is written to the memory cell MC11, the reset writing pulse is applied to the bit line BL1 via the transistor Q4, the source line SL1 is connected to the ground potential GND via the transistor Q3, such that the variable resistor element becomes to be the high-resistance state (HRS).

Figure 6:
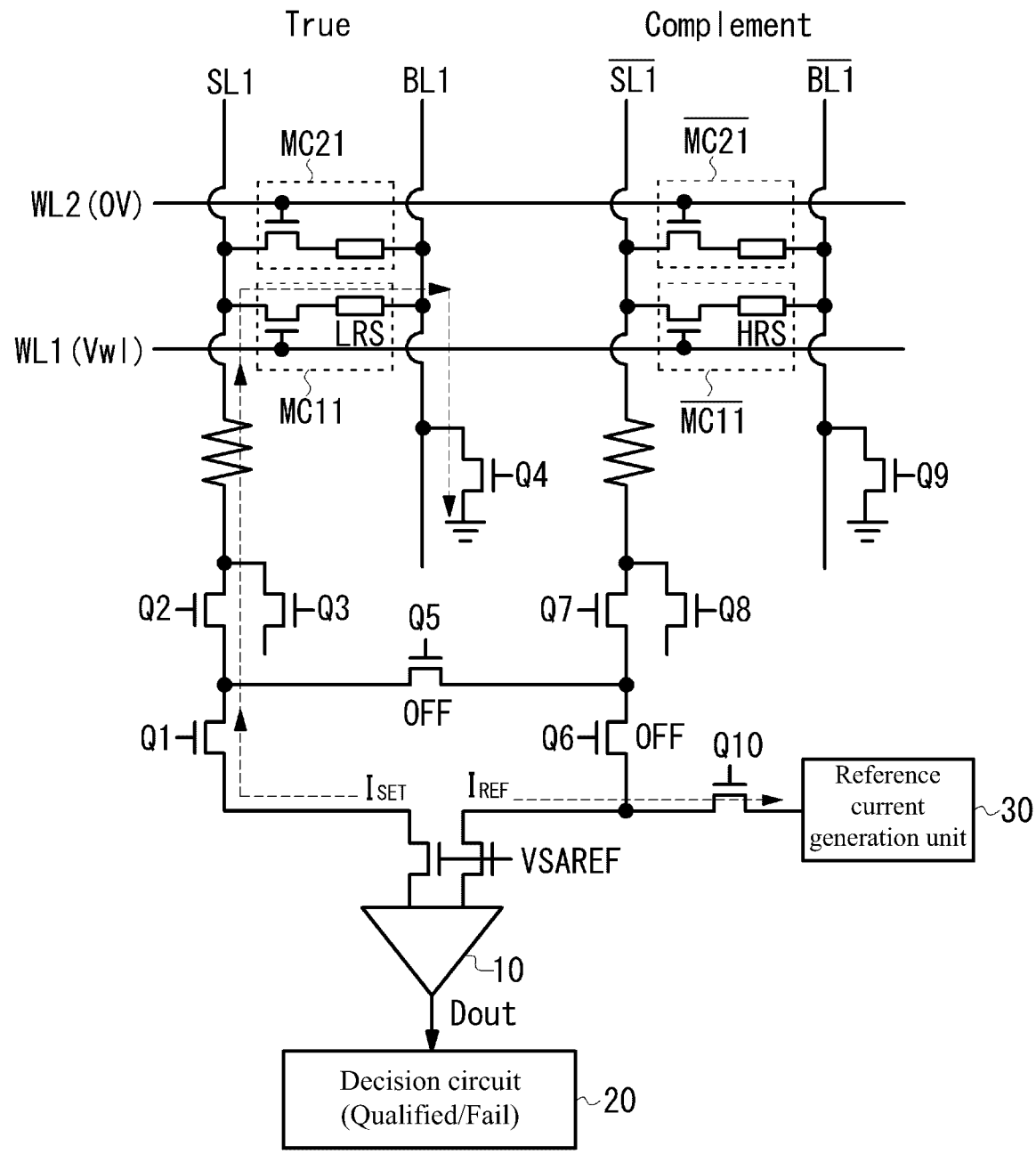
FIG. 6 is a diagram for explaining the set verification of a true memory cell.
Figure 7:
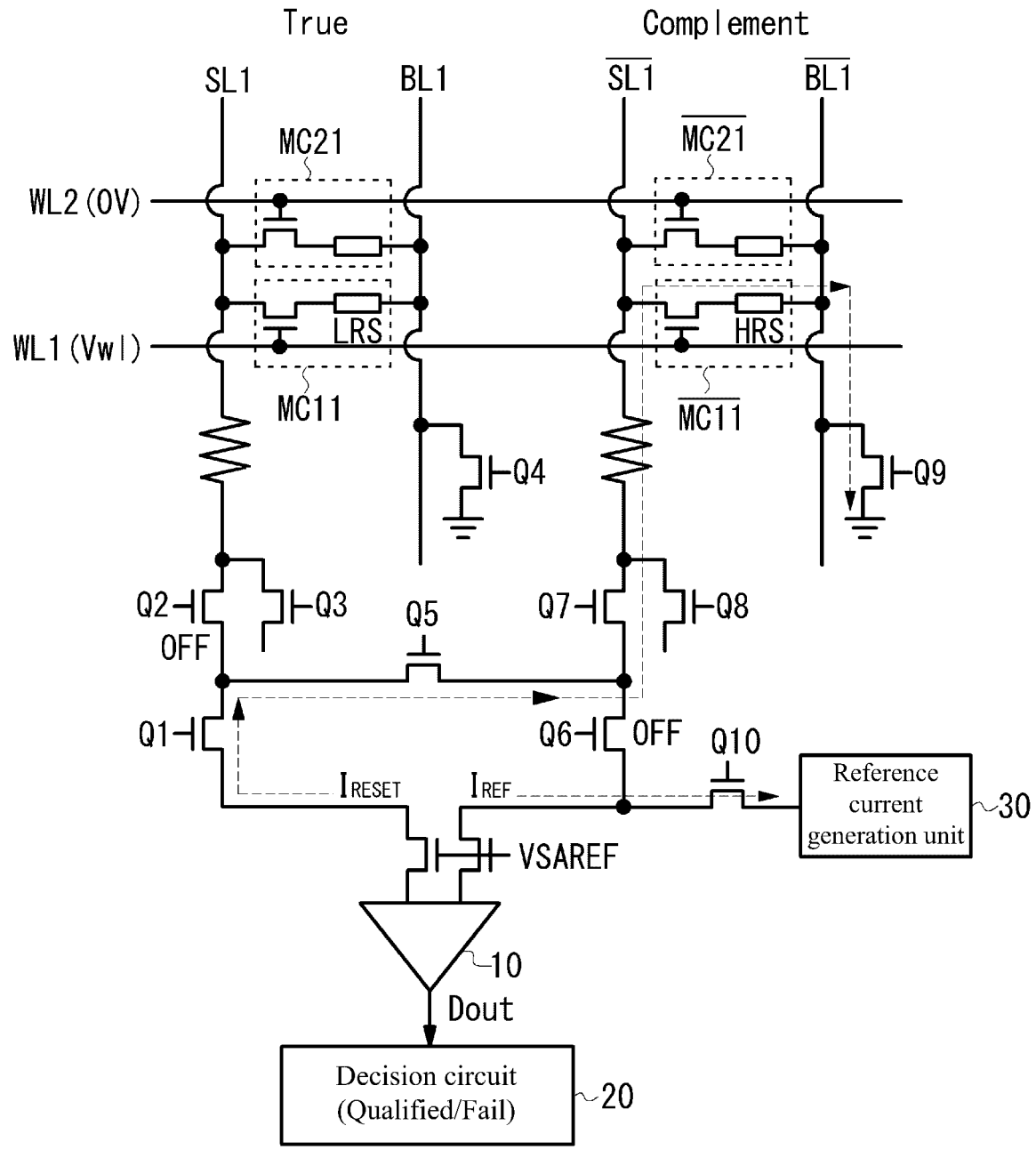
FIG. 7 is a diagram for explaining the reset verification of a complementary memory cell.

The conventional writing verification method for 2T2R memory cell array, as shown in FIG. 6 and FIG. 7, detects the current differences between the set-reference current $I_{REF}$/the reset-reference current $I_{REF}$ and the read currents $I_{SET}/I_{RESET}$, respectively. According to the writing verification method for 2T2R memory cell array in the present invention, it detects the current difference between the current $I_T$ flowing through the data line DL_T (source line SL) connected to the true memory cell, and the current $I_C$ flowing through the data line DL_C (source line $\overline{SL1}$) connected to the complementary memory cell. Moreover, in one present embodiment of the present invention, a Verify Sense Load Control (VSLC) signal is introduced to ensure the margin of the current difference, and the VSLC signal is used to provide an additional current to one or both of the data lines DL_T and DL_C based on the writing data. In addition, if the additional current is provided to the both data lines, the "+" (plus) current is added to the LRS side and the "−" (minus) current is added to the HRS side, so as to make the current difference not less than the required margin and thus correctly and effectively determine whether the writing is qualified (i.e. pass) or not.

For example, if the current flowing in the data line DL_T is more than the current flowing in the data line DL_C, the VSLC signal is configured to control providing the additional current to the data line DL_T; and if the current flowing in the data line DL_C is more than the current flowing in the data line DL_T, the VSLC signal is configured to control providing the additional current to the data line DL_C.

FIG. 9 shows an example of a verification operation during the set writing to the memory cells MC11 and $\overline{MC11}$. During the set writing of this embodiment, the variable resistor element R of the true memory cell MC11 switches to the low-resistance state (LRS), and the variable resistor element of the complementary memory cell $\overline{MC11}$ switches to the high-resistance state (HRS).

In this embodiment, when performing the verification operation, the source line SL1 of the selected true memory cell MC11 is coupled to one input of the sense amplifier 160 via the transistors Q1 and Q2, and the bit line BL1 connected to the ground potential GND via the transistor Q4; and the source line $\overline{SL1}$ of the selected complementary memory cell $\overline{MC11}$ is coupled to the other input of the sense amplifier 160 via the transistors Q6 and Q7, and the bit line $\overline{BL1}$ connected to the ground potential GND via the transistor Q9. The transistor Q5 connecting the source lines SL1 and $\overline{SL1}$ is optional, and if the transistor Q5 is arranged, it is turned off during the verification operation.

In response to the VSAREF signal from the control circuit 150, the transistors having outputs connected to the inputs of the sense amplifier 160, and gates connected to the VASREF signal will be turned on, thereby activating the sense amplifier 160. The sense amplifier 160 detects the current difference ΔI ($=|I_T-I_C|$) between the current $I_T$ flowing from the source line SL1 into the bit line BL1 via the memory cell MC11, and the current $I_C$ flowing from the source line $\overline{SL1}$ into the bit line $\overline{BL1}$ via the memory cell $\overline{MC11}$, so as to output the detected result to the decision circuit 180. The decision circuit 180 determines whether the verification is qualified based on the detected current difference ΔI. According to this embodiment, reducing circuit area and improving miniaturization for semiconductor memory device can be achieved by removing the reference current generation unit 30 and the transistor Q10 in the conventional art.

Figure 10A:
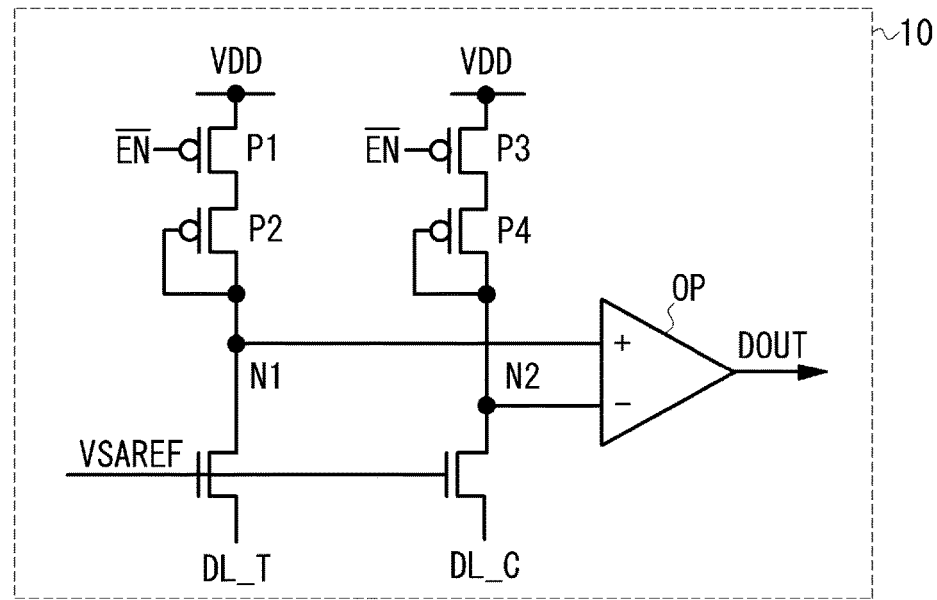
FIG. 10A is a diagram showing the structure of a conventional sense amplifier.
Figure 10B:
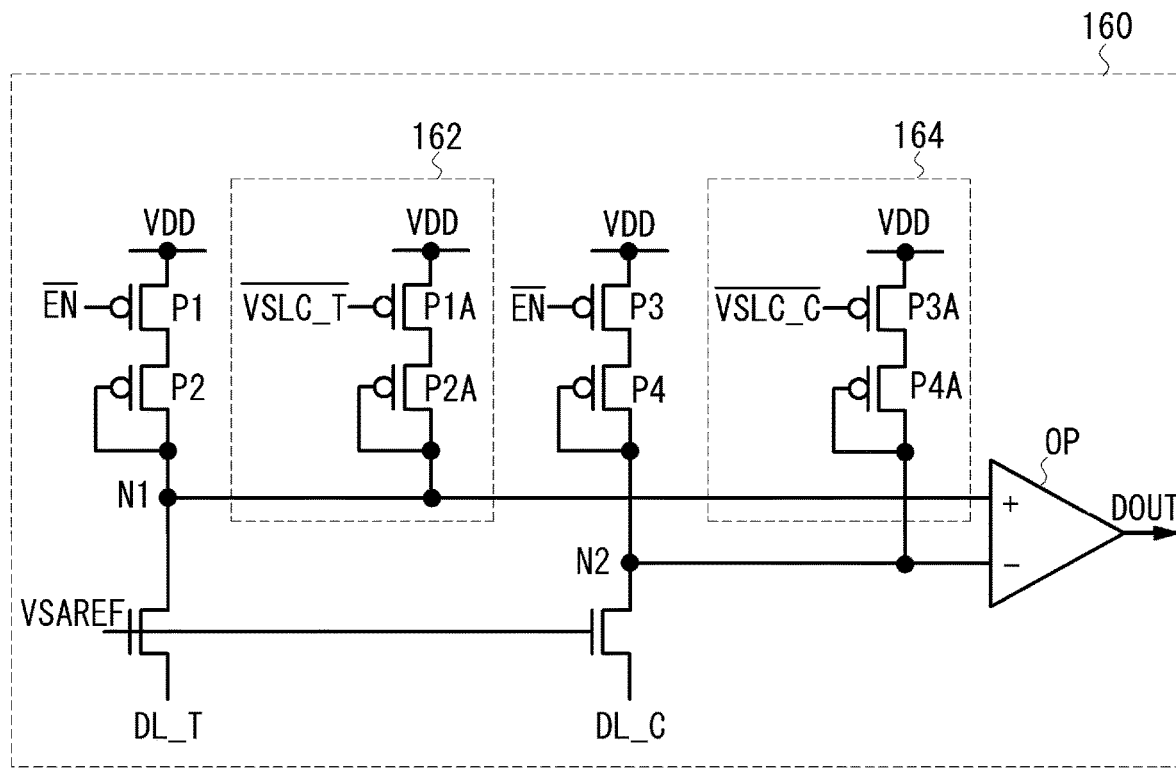
FIG. 10B is a diagram showing the structure of a sense amplifier according to one embodiment of the present invention.

FIG. 10A is a diagram showing the structure of a conventional sense amplifier 10, and FIG. 10B is a diagram showing the structure of a sense amplifier 160 according to this embodiment of the present invention. The conventional sense amplifier 10 comprises PMOS transistors P1~P4, and an operational amplifier OP. The PMOS transistors P1, P2 are connected in series between the power supply VDD and the data line DL_T of the true memory cell, and the PMOS transistors P3, P4 are connected in series between the power supply VDD and the data line DL_C of the complementary memory cell. The node N1 of the data line DL_T is connected to the non-inverting input terminal (+) of the operational amplifier OP, the node N2 of the data line DL_C is connected to the inverting input terminal (−) of the operational amplifier OP, and the operational amplifier OP detects the current difference between the nodes N1 and N2.

Each gate of the transistors P1, P3 is connected to the enable signal/EN from the control circuit 150. The transistors P1, P3 turn on during the reading operation, and operate as current sources. The transistors P2 and P4 have gates connected to the nodes N1 and N2 respectively, and provide currents to the loads of the variable resistor elements connected thereto. The operational amplifier OP detects the current difference between the nodes N1 and N2, and outputs the detected result to the decision circuit 20.

On the other hand, the sense amplifier 160 of this embodiment, apart from the structure as shown in FIG. 10A, further has a first current source 162 (also referred to as first current addition unit), and a second current source 164 (also referred to as second current addition unit). The first current source 162 is connected to the first node N1, and is connected in parallel with the current path composed of the transistors P1 and P2. The second current source 164 is connected to the second node N2, and connected in parallel with the current path composed of the transistors P3 and P4.

The first current source 162 includes the PMOS transistor P1A and P2A, which are connected in series between the power supply VDD and the node N1. The gate of the transistor P1A is connected to the control signal $\overline{VSLC\_T}$, and the gate of the transistor P2A is connected to the node N1. During the verification of the set writing, the transistor P1A is turned on by the control signal $\overline{VSLC\_T}$, and provides the additional current $I_{ADD}$ to the node N1 via the transistor P2A.

The second current source 164, having the same structure as that of the first current source 162, in other words, includes the PMOS transistors P3A, P4A which are connected in series between the power supply VDD and the node N2. The gate of the transistor P3A is connected to the control signal $\overline{VSLC\_C}$, and the gate of the transistor P4A is connected to the node N2. During the verification of the reset writing, the transistor P3A is turned on by the control signal VSLC_C, and provides the additional current $I_{ADD}$ to the node N2 via the transistor P4A.

Figure 4:
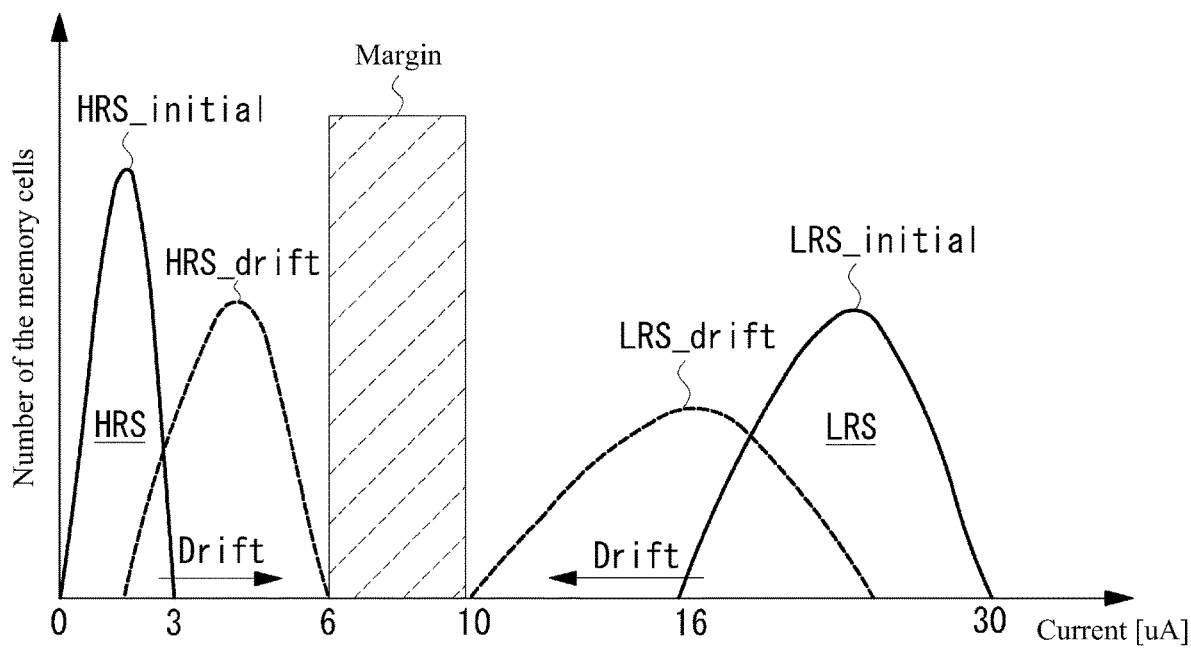
FIG. 4 shows the current distributions of a memory cell being set or reset.
Figure 5:
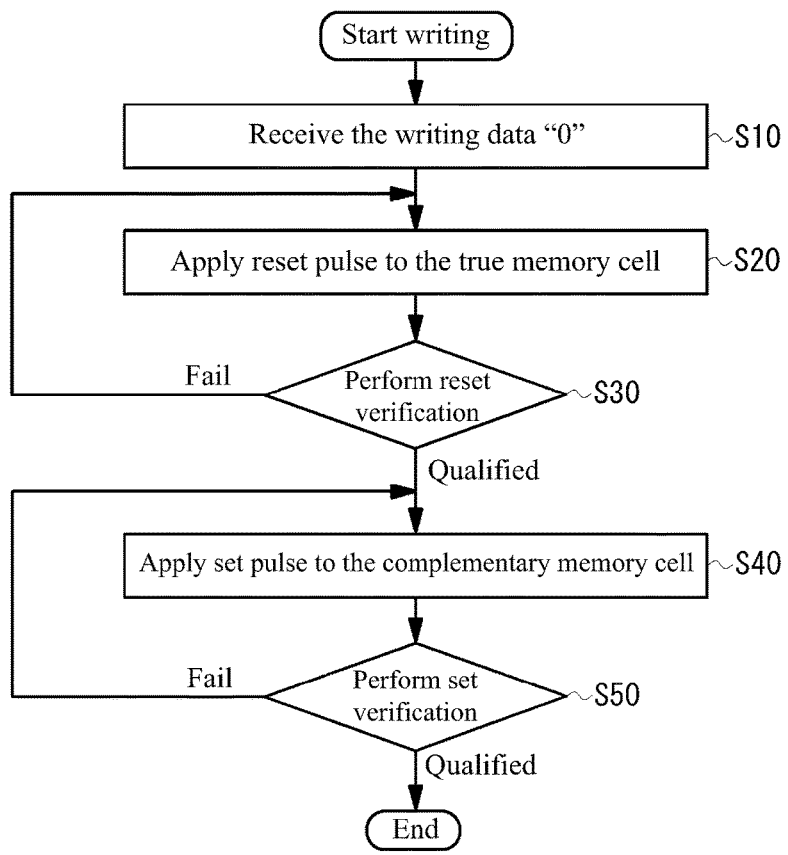
FIG. 5 shows a conventional verification process for reset writing.

In one embodiment, the first current source 162 composed of the transistors P1A, P2A and the second current source 164 composed of the transistors P3A, P4A have the same structure. In addition, the additional currents $I_{ADD}$ provided by the first current source 162 and the second current source 164 can be appropriately set according to the required margin for correctly detecting the current difference ΔI For example, if the current distribution of setting/resetting is shown as FIG. 4, the additional current $I_{ADD}$ may be set as 16 μA. By this manner, the output currents from the nodes N1 and N2 can be adjusted, and therefore the required margin of the current difference, with the tail bit shift taken into consideration, is obtained. In addition, the first current source 162 and the second current source 164 are not limited to the structure as shown in FIG. 10B, and may be composed of constant current circuits which provide additional currents $I_{ADD}$ to the nodes N1 and N2.

FIG. 11A and FIG. 11B show true tables of the control signals $\overline{VSLC\_T}$, $\overline{VSLC\_C}$, and the enable signal $\overline{EN}$. During the verification for set writing, the control circuit 15 outputs the control signals $\overline{VSLC\_T}$=L, $\overline{VSLC\_C}$=H, and the enable signal $\overline{EN}$=L. By this manner, the additional current $I_{ADD}$ from the first current source 162 and the current $I_{MC}$ flowing through the memory cell MC11 are added together, and is output from the node N1. In addition, the additional current $I_{ADD}$ from the second current source 164 is not added to the node N2. Therefore, the current $I_T$, flowing through the data line DL_T connected to the true memory cell, is $I_{MC}+I_{ADD}$ ($I_{MC}$ is the current flowing through the true memory cell), and the current $I_C$, flowing through the data line DL_C connected to the complementary memory cell, is $I_{\overline{MC}}$ ($I_{\overline{MC}}$ is the current flowing through the complementary memory cell). The setting or/and resetting pulse are applied repeatedly, until the operational amplifier OP detects the current difference which is not less than the additional current $I_{ADD}$, which means the set writing is performed successfully. In other words, compared with the case without the first current source 162, the current difference between the nodes N1 and N2 in this embodiment can be ensured to be not less than the additional current $I_{ADD}$. Even though the tail bit shift occurs, the operational amplifier OP can correctly read out the reading data, by setting the additional current $I_{ADD}$ to an appropriate value (for example, the required margin of the current difference, which has taken the tail bit shift into consideration).

On the other hand, during the verification operation for the reset writing, the control circuit 150 outputs the control signals $\overline{VSLC\_T}$=H, $\overline{VSLC\_C}$=L, and the enable signal $\overline{EN}$=L. By this manner, the additional current $I_{ADD}$ from the second current source 164 and the current $I_{MC}$ flowing through the memory cell $\overline{MC11}$ are added together, and is output from the node N2. In addition, the additional current $I_{ADD}$ from the first current source 162 is not added to the node N1. Therefore, the current $I_C$, flowing through the data line DL_C connected to the complementary memory cell, is $I_{\overline{MC}}+I_{ADD}$, and the current $I_T$, flowing through the data line DL_T connected to the true memory cell, is $I_{MC}$. In other words, compared with the case without the second current source 164, the current difference between the nodes N1 and N2 in this embodiment can be ensured to be not less than the additional current $I_{ADD}$. Even though the tail bit shift occurs, the operational amplifier OP can correctly readout the reading data, by setting the additional current $I_{ADD}$ to an appropriate value (for example, the required margin of the current difference with the tail bit shift taken into consideration).

Figure 12:
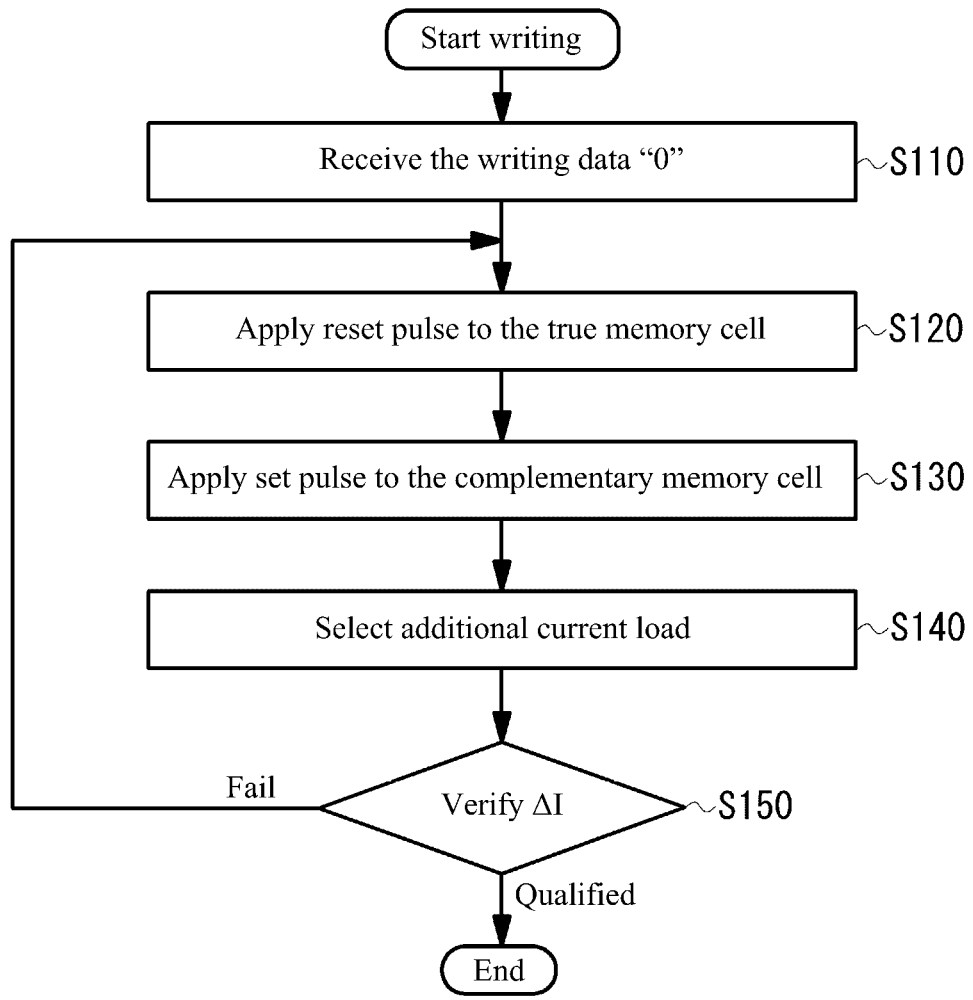
FIG. 12 shows a verification process of the present embodiment.

FIG. 12 shows the process of a verification operation during the reset writing in the variable-resistance memory according to this embodiment. First, the control circuit 150 receives the writing data "1" (S110), and applies the reset writing pulse to the true memory cell (S120) via the write-driving/bias-reading circuit 170, and then applies the set writing pulse to the complementary memory cell (S130). Next, the control circuit 150 outputs the control signals $\overline{VSLC\_T}$=H $\overline{VSLC\_C}$=L for selecting the second current source 164 (S130). Next, the sense amplifier OP detects the current difference ΔI between the current $I_T$ flowing through the data line DL_T connected to the true memory cell, and the current $I_C$ flowing through the data line DL_C connected to the complementary memory cell. The decision circuit 180 determines whether the verification is qualified or not based on the current difference ΔI (S150). If the verification is fail, the steps S120 to S140 are repeated, and if the verification is qualified, the reset writing is completed. In addition, the similar verification is performed during the verification for the set writing.

According to this embodiment, during the verification for set/reset writing, whether the verification is qualified or not is determined based on the detected result of the current difference ΔI between the current $I_T$ flowing through the data line DL_T connected to the true memory cell, and the current $I_C$ flowing through the data line DL_C connected to the complementary memory cell. Therefore, even though the wiring resistance and the load capacitance of the data lines DLC_T and DLC_C change depending on different position of the selected memory cell, the wiring resistance and the load capacitance of both the data lines can be offset, thereby avoiding the influence on the current difference and correctly determining whether the verification is qualified. In addition, the verification accuracy can be ensured by the additional current $I_{ADD}$ for increasing the current difference, based on the writing data. Even though the current distributions of the high-resistance state and low-resistance state have shifts, the set/reset writing can be performed until a current difference is ensured for correct reading. In addition, because no need to adjust the bias conditions (levels of WL/SL/BL) being read or the reference current according the position of the selected memory cell, the circuit complexity or circuit area of the present invention can be reduced. In addition, this embodiment, different from the conventional art, does not require two verifications when performing one set or reset writing. In other words, only one verification is required when one set or reset writing is performed in the present embodiment, thus reducing the time for set/reset writing.

In other words, instead of using the reference current for the set or reset writing verification after the writing pulse and before the complement writing pulse, based on this embodiment, whether the writings to the true memory cell and the complementary cell are qualified are verified at the same time, by detecting the current difference ΔI between the current $I_T$ and the current $I_C$ after the writing pulses being applied. Therefore, the required time for the writing is shortened.

Figure 13:
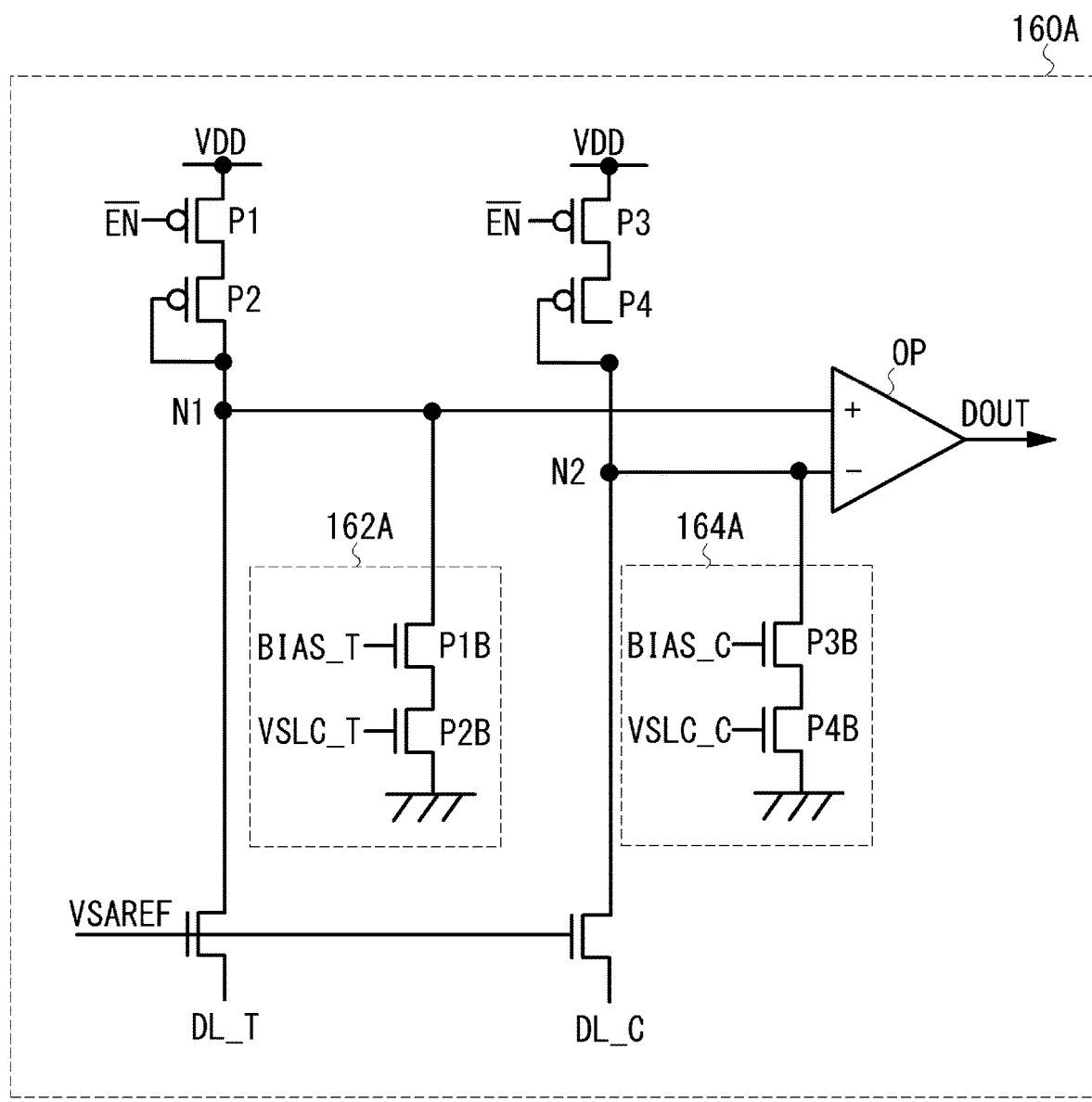
FIG. 13 is a diagram showing the structure of a sense amplifier according to a second sense amplifier according to the present invention.

Next, the second embodiment according to the present invention is described. FIG. 13 shows the structure of the sense amplifier of the second embodiment. The sense amplifier 160 of the first embodiment includes the first current source 162 and the second source 164, which are connected in parallel with the current supply from the power supply VDD, for providing additional current $I_{ADD}$ to the nodes N1 and N2. The sense amplifier 160A of the second embodiment includes the first current source 162A and the second current source 164A, which are connected in parallel with the data lines DL_T and DL_C, for connecting the nodes N1 and N2 to the ground potential GND, thereby providing additional current IADD to the nodes N1 and N2.

In this embodiment, the first current source 162A includes NMOS transistors P1B and P2B connected between the node N1 and the ground potential GND. The gate of the transistor P1B is coupled with the bias signal BIAS_T; the gate of the transistor P2B is coupled with the control signal VSLC_T. The second current source 164A includes NMOS transistors P3B and P4B connected between the node N2 and the ground potential GND. The gate of the transistor P3B is coupled with the bias signal BIAS_C; the gate of the transistor P4B is coupled with the control signal VSLC_C. The transistors P1B, P2B of the first current source 162A and the transistors P3B, P4B of the second current source 164A have the same structures. The bias signals BIAS_T, BIAS_C are analog voltages of positive value and may be generated by the control circuit 150. The transistors P1B and P3B operate as current sources. In an alternative embodiment, the gates of the transistors P1B and P3B may be coupled with a common bias signal.

In this embodiment, during the verification for set writing, the control circuit 150 outputs the control signals VSLC_T=H, VSLC_C=L. Thereby, the first current source 162A is enabled and the second current source 164A is disabled, and the node N1 is connected to the ground potential GND such that the node N1 equivalently outputs the summation current of the current $I_{MC}$ flowing through the memory cell MC11 and the additional current $I_{ADD}$ provided by the first current source 162A. Therefore, the current $I_T$ flowing through the data line DL_T connected to the true memory cell is equal to $I_{MC}+I_{ADD}$, and the current $I_C$ flowing through the data line DL_C connected to the complementary memory cell is equal to $I_{MC}$. In the state of ensuring the current difference $\Delta I$ at least equal to the addition current, the operational amplifier OP compares the currents $I_T$ and $I_C$, and the decision circuit 180 makes a determination based on the comparison result. In term of the result, the current difference $\Delta I$ can be ensured not less than the addition current, during the reading after the writing has finished.

On the other hand, during the verification for reset writing, the control circuit 150 outputs the control signals VSLC_T=L, VSLC_C=H. Thereby, the first current source 162A is disabled and the second current source 164A is enabled, and the node N2 is connected to the ground potential GND such that the node N2 equivalently outputs the summation current of the current $I_{MC}$ flowing through the memory cell MC11 and the additional current $I_{ADD}$ provided by the second current source 164A. Therefore, the current $I_C$ flowing through the data line DL_C connected to the complementary memory cell is equal to $I_{MC}+I_{ADD}$, and the current $I_T$ flowing through the data line DL_T connected to the true memory cell is equal to $I_{MC}$. The current difference $\Delta I$ is equal to $I_{\overline{MC}}+I_{ADD}-I_{MC}$. In the state of ensuring the current difference $\Delta I$ at least equal to the addition current, the operational amplifier OP compares the currents $I_T$ and $I_C$, and the decision circuit 180 makes a determination based on the comparison result. In term of the result, the current difference $\Delta I$ can be ensured not less than the addition current, during the reading after the writing has finished.

In the above embodiment, the first current source 162A is composed of the transistors P1B and P2B and the second current source 164A is composed of the transistors P3B and P4B, but it is merely an example. Other constant current circuits may be used to generate the additional current $I_{ADD}$. In addition, although the additional current $I_{ADD}=16$ µA is illustrated in the above embodiment, this is just an example; for example, the additional current $I_{ADD}$ may be properly set according to the detection accuracy of the operational amplifier OP.

In addition, although the first embodiment and the second embodiment are disclosed respectively, the combination of the first and second embodiments is feasible. For example, the first current source 162 is connected between the power supply VDD and the node N1, and simultaneously the first current source 162A is connected between the node N1 and the ground potential GND. Similarly, the second current source 164 is connected between the power supply VDD and the node N2, and simultaneously the second current source 164A is connected between the node N2 and the ground potential GND.

In the above embodiments, the variable-resistance memory having memory cells arranged in a two-dimension array is illustrated, but the present invention can be applied to the variable-resistance memory having memory cells arranged in a three-dimension array. In addition, the present invention can be applied to the other semiconductor memory device, besides the variable-resistance memory. For example, the present invention can be applied to NOR-type flash memory, etc. which can store complementary data.

Although preferred embodiments of the present invention have been described in detail, the present invention is not limited to specific embodiments, and various modifications and variations can be made within the spirit and scope of the invention described in the claims.

What is claimed is:

1. A semiconductor memory device, comprising:
    a memory cell array, having a plurality of memory cells;
    a write-driving/bias-reading circuit configured to apply a writing pulse and a complementary writing pulse to a pair of memory cells selected from the memory cell array, the writing pulse and the complementary writing pulse corresponding to writing data and complementary data of the writing data, respectively;
    a control circuit, configured to output a VSLC (Verify Sense Load Control) signal which is generated according to the writing data;
    a sense amplifier, configured to receive the VSLC signal after the writing pulse and the complementary writing pulse are applied, and to detect a current difference between a first current flowing through a first data line connected to a true memory cell of the pair of memory cells and a second current flowing through a second data line connected to a complementary memory cell of the pair of memory cells;
    wherein by the VSLC signal, the control circuit controls to provide an additional current to at least one of the first data line and the second data line to make the current difference at least meet a required margin.

2. The semiconductor memory device as claimed in claim 1,
wherein the VSLC signal is configured to control providing the additional current to the first data line in response to the first current flowing through the first data line greater than the second current flowing through the second data line; and
wherein the VSLC signal is configured to control providing the additional current to the second data line in response to the current flowing through the second data line greater than the first current flowing through the first data line.

3. The semiconductor memory device as claimed in claim 2,
wherein the sense amplifier comprises:
an operational amplifier, configured to detect the current difference between the first current flowing through the first data line and the second current flowing through the second data line;
a first current addition unit, configured to provide the additional current to the first data line according to the VSLC signal; and
a second current addition unit, configured to provide the additional current to the second data line according to the VSLC signal.

4. The semiconductor memory device as claimed in claim 3,
wherein the first data line is connected to a first current-providing unit via a first node, and the second data line is connected to a second current-providing unit via a second node;
wherein the first node and the second node are connected respectively to a first input and a second input of the operational amplifier;
wherein the first current addition unit and the first current-providing unit are connected to the first node in parallel; and
wherein the second current addition unit and the second current-providing unit are connected to the second node in parallel.

5. The semiconductor memory device as claimed in claim 3,
wherein the first data line is connected to the first current-providing unit via the first node, and the second data line is connected to the second current-providing unit via the second node;
wherein the first node and the second node are respectively connected to a first input and a second input of the operational amplifier;
wherein the first current addition unit is connected between the first node and a ground potential, and further connected in parallel with the first data line to the first node;
wherein the second current addition unit is connected between the second node and the ground potential, and further connected in parallel with the second data line to the second node.

6. The semiconductor memory device as claimed in claim 3,
wherein each of the memory cells comprises:
a variable resistor element; and
an access transistor, connected to the variable resistor element;
wherein after the write-driving/bias-reading circuit provides the true memory cell with the writing pulse for writing the true memory cell to a low-resistance state, the sense amplifier provides the additional current to the first data line connected to the true memory cell via the first current addition unit, not providing the additional current to the second data line connected to the complementary memory cell;
wherein after the write-driving/bias-reading circuit provides the true memory cell with the writing pulse for writing the true memory cell to a high-resistance state, the sense amplifier provides the additional current to the second data line connected to the complementary memory cell via the second current addition unit, not providing the additional current to the first data line connected to the true memory cell.

7. The semiconductor memory device as claimed in claim 4,
wherein each of the memory cells comprises:
a variable resistor element; and
an access transistor, connected to the variable resistor element;
wherein after the write-driving/bias-reading circuit provides the true memory cell with the writing pulse for writing the true memory cell to a low-resistance state, the sense amplifier provides the additional current to the first data line connected to the true memory cell via the first current addition unit, not providing the additional current to the second data line connected to the complementary memory cell;
wherein after the write-driving/bias-reading circuit provides the true memory cell with the writing pulse for writing the true memory cell to a high-resistance state, the sense amplifier provides the additional current to the second data line connected to the complementary memory cell via the second current addition unit, not providing the additional current to the first data line connected to the true memory cell.

8. The semiconductor memory device as claimed in claim 5,
wherein each of the memory cells comprises:
a variable resistor element; and
an access transistor, connected to the variable resistor element;
wherein after the write-driving/bias-reading circuit provides the true memory cell with the writing pulse for switching the true memory cell into a low-resistance state, the sense amplifier provides the additional current to the first data line connected to the true memory cell via the first current addition unit, not providing the additional current to the second data line connected to the complementary memory cell;
wherein after the write-driving/bias-reading circuit provides the true memory cell with the writing pulse for switching the true memory cell into a high-resistance state, the sense amplifier provides the additional current to the second data line connected to the complementary memory cell via the second current addition unit, not providing the additional current to the first data line connected to the true memory cell.

9. The semiconductor memory device as claimed in claim 1, further comprising a decision circuit, configured to verify whether a write-in is qualified according to the current difference detected by the sense amplifier;
wherein in response to the verification qualified by the decision circuit, the write-driving/bias-reading circuit finishes the write-in;
wherein in response to the verification being fail by the decision circuit, the write-driving/bias-reading circuit applies again the writing pulse and the complementary pulse to the selected pair of memory cells.

10. The semiconductor memory device as claimed in claim 3,
wherein according to the writing data, the control circuit generates a first VSLC (Verify Sense Load Control) signal and a second VSLC signal, which are complementary each other, providing the first and second VSLC signals to the first current addition unit and the second current addition unit, respectively;
wherein the first current addition unit and the second current addition unit provide the additional current in response to the first VSLC signal and the second VSLC signal, respectively.

11. The semiconductor memory device as claimed in claim 10,
wherein the first current addition unit comprises:
a first transistor, connected to a power supply, and turning on or turning off in response to the first VSLC signal; and
a second transistor, connected in series between the first transistor and the first node, and having a gate coupling to the first node; and
wherein the second current addition unit comprises:
a third transistor, connected to the power supply, and turning on or turning off in response to the second VSLC signal; and
a fourth transistor, connected in series between the third transistor and the second node, and having a gate coupling to the second node.

12. The semiconductor memory device as claimed in claim 10,
wherein the first current addition unit comprises:
a first transistor, connected to a ground potential, and turning on or turning off in response to the first VSLC signal; and
a second transistor, connected in series between the first transistor and the first node; and
wherein the second current addition unit comprises:
a third transistor, connected to the ground potential, and turning on or turning off in response to the second VSLC signal; and
a fourth transistor, connected in series between the third transistor and the second node;
wherein the control circuit further generates a bias signal, and provides the bias signal to the gates of the second transistor and the fourth transistor.

13. A method of writing a semiconductor memory device, for writing a pair of memory cells selected from a memory cell array of the semiconductor memory device, the method comprising:
receiving writing data;
applying a writing pulse to a true memory cell of the selected pair of memory cells;
applying a complementary writing pulse, which is complementary with respect to the writing pulse, to a complementary memory cell of the selected pair of memory cells;
generating a VSLC (Verify Sense Load Control) signal according to the writing data;
after the writing pulse and the complement writing pulse being applied, receiving the VSLC signal by a sense amplifier of the semiconductor memory device, and detecting a current difference between a first current flowing through a first data line connected to the true memory cell and a second current flowing through a second data line connected to the complementary memory cell;
wherein before the current difference being determined, providing an additional current to at least one of the first data line and the second data line according to the VSLC signal, to make the current difference at least meet a required margin.

14. The method of writing a semiconductor memory device as claimed in claim 13, further comprising:
verifying whether the writing to the pair of memory cells (write-in) is qualified;
finishing the write-in in response to the verification being qualified;
applying again the writing pulse and the complementary pulse to the selected pair of memory cells in response to the verification being fail.

15. The method of writing a semiconductor memory device as claimed in claim 13, wherein in response to the first current flowing through the first data line greater than the second current flowing through the second data line, provide the additional current to the first data line according to the VSLC signal; and
wherein in response to the second current flowing through the second data line greater than the first current flowing through the first data line, provide the additional current to the second data line according to the VSLC signal.

16. The method of writing a semiconductor memory device as claimed in claim 13, wherein after applying the writing pulse corresponding to a low-resistance state to the true memory cell, only provide the additional current to the first data line connected to the true memory cell; and
wherein after applying the writing pulse corresponding to a high-resistance state to the true memory cell, only provide the additional current to the second data line connected to the complementary memory cell.

17. The method of writing a semiconductor memory device as claimed in claim 13, wherein after the writing pulse is applied and before the complementary writing pulse is applied, a reference current is not used for verifying whether the writing to the pair of memory cells (write-in) is qualified.

18. The method of writing a semiconductor memory device as claimed in claim 14, wherein after applying the writing pulse corresponding to a low-resistance state to the true memory cell, only provide the additional current to the first data line connected to the true memory cell; and
wherein after applying the writing pulse corresponding to a high-resistance state to the true memory cell, only provide the additional current to the second data line connected to the complementary memory cell.

19. The method of writing a semiconductor memory device as claimed in claim 14, wherein after the writing pulse is applied and before the complementary writing pulse is applied, a reference current is not used for verifying whether the writing to the pair of memory cells (write-in) is qualified.

* * * * *